United States Patent [19]

Smolley

[11] Patent Number: 5,311,058
[45] Date of Patent: May 10, 1994

[54] INTEGRATED CIRCUIT POWER DISTRIBUTION SYSTEM

[75] Inventor: Robert Smolley, Porteuguese Bend, Calif.

[73] Assignee: TRW Inc., Redondo Beach, Calif.

[21] Appl. No.: 800,294

[22] Filed: Nov. 29, 1991

[51] Int. Cl.⁵ .................. H01L 23/48; H01L 23/44; H01L 23/52; H01L 23/60

[52] U.S. Cl. .................................. 257/691; 257/692

[58] Field of Search ............. 357/68, 74, 80, 71, 357/69; 257/691, 666, 693, 700, 664, 692, 773, 774, 775, 776

[56] References Cited

U.S. PATENT DOCUMENTS

| | | | |
|---|---|---|---|
| 4,751,482 | 6/1988 | Fukuta et al. | 357/74 |
| 4,811,082 | 3/1989 | Jacobs et al. | 357/80 |
| 5,119,169 | 6/1992 | Kozono et al. | 357/68 |

Primary Examiner—Sheila V. Clark
Attorney, Agent, or Firm—Ronald L. Taylor

[57] ABSTRACT

A power distribution system for distributing power to an IC is formed by attaching a grid having at least one power bus and one ground bus to the top surface of the IC die. The grid is adapted to be electrically coupled with power and ground pins in the IC's package. The grid has an insulative layer on its bottom surface to electrically isolate the grid's bottom surface from the IC. The grid is adapted to cover substantially the entire top surface of the IC and to be electrically coupled directly from the top surface of the grid to terminal or connection points on the top surface of the IC. The connection points can be distributed throughout the IC to reduce the area of metallization in the IC and the path length the current from the power busses must traverse.

13 Claims, 7 Drawing Sheets

INTEGRATED CIRCUIT POWER DISTRIBUTION SYSTEM

BACKGROUND OF THE INVENTION

1. Field of the Invention

This invention relates to ultra-dense large scale integration of microelectronic components in integrated circuits (ICs), and more particularly to structures for distributing power to such circuits using a grid assembly attached to the top surface of the IC die and wire bonding down from the grid to the IC die surface.

2. Description of Related Art

Technological improvements in the electronics industry have made larger, more highly integrated ICs possible, and correspondingly, increased the demands upon the IC's power distribution system. Improved production methods allow the die size to increase and the feature size to decrease. The smaller feature size allows for more densely placing the microelectronic components on the die, and also allows for a lower operating voltage. By more highly integrating these components, VHSIC devices are achieved.

The demands on the distribution system for the improved ICs include: increased power demand per unit area of IC since more components reside in a unit area; longer path lengths for the current to traverse to reach the interior of the IC; greater sensitivity to drops in voltage due to the lower operating voltage of some types of ICs; greater demand for available die area for signal lines to interconnect the larger number of components; greater demand for Input/Output (I/0) pins on the IC package since there are more components to send or receive signals outside the IC.

Prior art power distribution systems can be inadequate because they typically provide power to the IC from the IC's periphery. Metallized areas on the IC, typically thin film metallization, bring current from the periphery to the interior of the IC. However, these metallized areas have a finite resistivity, and therefore, the voltage drops as the current flows toward the interior of the IC. In the large ICs, this voltage drop can exceed the operating requirements of the IC because the path length is longer and therefore the voltage drop greater. Moreover, this problem becomes more acute as the IC's operating voltage decreases. For example, some new CMOS devices are designed to operate at 3 volts instead of the typical 5 volts. A given voltage drop represents a larger percentage of the operating voltage in the 3 volt device, and hence, the 3 volt device cannot tolerate as large a voltage drop as a 5 volt device. In addition, the metallized areas for providing power to the IC use up valuable area that could be more advantageously used for more components and/or interconnect wiring.

Prior art solutions to these problems include increasing the metallized areas that bring power to the interior of the IC to reduce current density per unit length, and therefore, voltage drop per unit length. This solution is undesirable because it uses up even more valuable area; moreover, it increases the mean distance between components and therefore the mean propagation time between components.

In some multichip module applications, wire bonding to a ceramic substrate containing power busses is used to bring power to the ICs. The same problems arise as the multichip modules get larger. Valuable area is used for power busses that could otherwise be used for interconnects, making increases in the area used for power busses (in an effort to reduce voltage drop) undesirable. If the multichip module contains the large ICs described above, the problem is even further compounded. This solution appears to be practical only for small ICs and multichip modules.

Another prior art solution is disclosed in U.S. Pat. No. 4,612,564. Moyer describes an IC package that incorporates a leaded frame with cross-under members for power distribution. Bonds are made from the underside of the IC to the frame and cross-under members. This package uses the valuable area on the underside of the IC die for power distribution. As is well known, large ICs use their undersides in conjunction with standard packages to access I/O pins, making Moyer's IC package undesirable for these applications.

The present invention is directed to an improved power distribution system for ICs that overcome the limitations or problems of the prior art power distribution systems.

SUMMARY OF THE INVENTION

Pursuant to the present invention, a power distribution system for distributing power to an IC is formed by attaching a grid having power and ground busses to the top surface of the IC die. The grid is adapted to be electrically coupled with power and ground pins in the IC's package. The grid has an insulative layer on its bottom surface to electrically isolate the grid's bottom surface from top surface of the IC die. The grid can cover substantially the entire top surface of the IC die. The grid is electrically coupled directly from the top surface of the grid to points or pads or terminals on the top surface of the IC die. The connection points can be distributed throughout the IC die to reduce the area of metallization in the IC die and the current path length to and from the power and ground busses.

The present invention also is directed to a method of distributing power to an IC die comprising attaching the bottom surface of a conductive grid to the top surface of an IC die, the grid including separate power and ground busses. An insulative layer is applied to the bottom surface of the grid and the top surface of the IC die to electrically insulate the grid from the die. Conductors are attached to the grid's top surface and attached to the IC die's power and ground pads or terminals located on the top surface of the die to electrically couple the IC die to power and ground. The IC die and attached grid are mounted in an IC package. Conductors are attached from the grid's top surface to the power and ground I/O pads of the package to electrically couple the grid to the package's power and ground I/O pins. The grid can be attached to a plurality of IC dies. The connector conductors from the grid's top surface to the IC pads can be made with conventional wire bonding machines.

DETAILED DESCRIPTION OF THE PREFERRED EMBODIMENT

Figure 1:
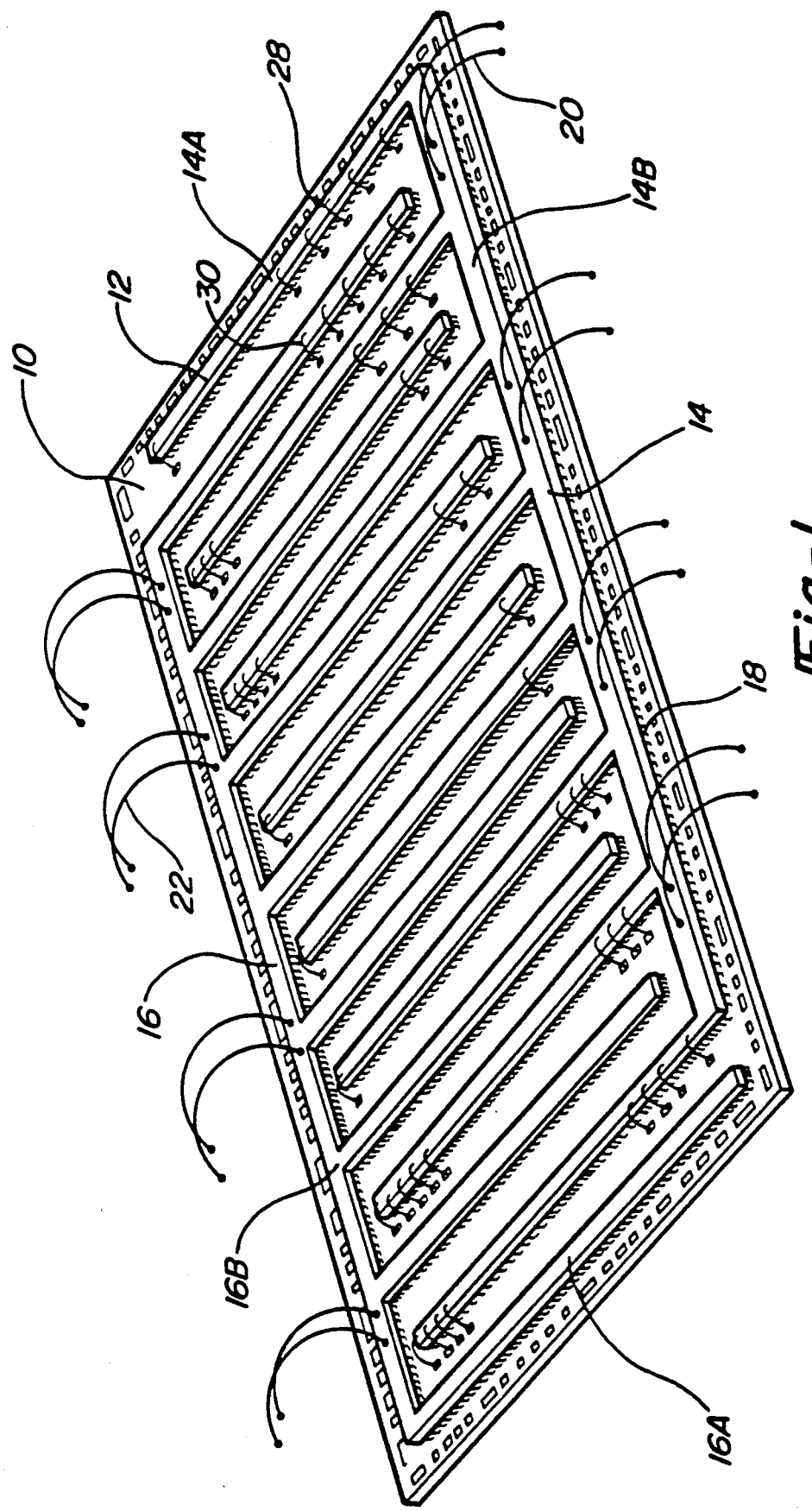
FIG. 1 a perspective view of a generic IC fitted with one embodiment of a power distribution system of the present invention.

Referring to FIG. 1, a representative IC 10 is depicted fitted with a grid 12 as taught by the present invention. Here, the grid 12 is made up of a power bus 14 and a ground bus 16. As depicted in the figure, the power bus is a planar structure with fingers 14A extending perpendicularly from a header portion 14B. Similarly, the ground bus has fingers 16A and header portion 16B. The fingers fit together in a spaced apart interleaved fashion without touching each other. In this embodiment, the bottom surface of the grid is attached to the top surface of the IC using a compliant non-conductive adhesive, such as THK RTV silicone, Dow Corning 93-500, to form an insulative layer 18. When the grid is attached to the IC, the grid, insulative layer, and the IC all lie in substantially parallel planes.

The power and ground busses 14 and 16 are electrically coupled with the IC's package 36 (See FIGS. 2, 4, 6 and 7) with conductors 20 and 22, respectively. In a typical application, the package has Input/Output (I/O) pins 38 electrically coupled with power and ground from an off-package voltage source (not shown). Power bus 14 is coupled with the power I/O pins through conductors 20 and terminal 24 (See FIGS. 2, 5, 6 and 7). The conductors 22 couple the ground bus 16 to the package ground I/O pins through terminal 26.

Power and Ground conductors 28 and 30 (See FIG. 6), respectively, couple the grid to the IC. Although conductors 20 and 22 are depicted at specific points along the busses 14 and 16, these conductors can be placed at any point along the busses. It is contemplated that the conductors 28 and 30 are wire bonds installed using conventional wire bonding machines.

Figure 2:
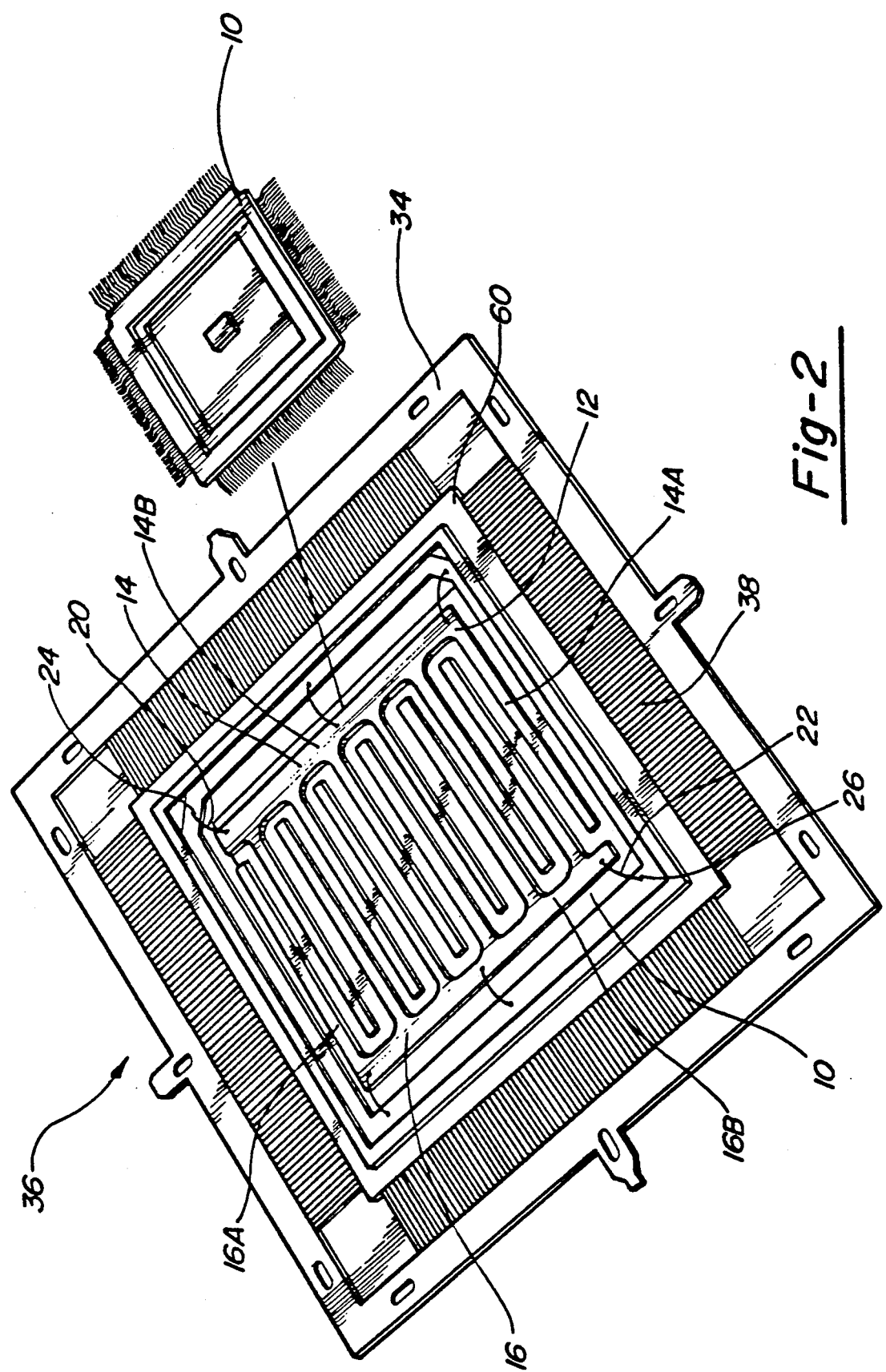
FIG. 2 is a perspective view of an IC package with an IC and power distribution system in place.

FIG. 2 illustrates an IC package 36 wherein the IC 10 is fitted with a grid 12 and mounted in a package picture frame 60. The conductors 28 and 30 have been omitted for clarity. Each I/O pin 38, located on the periphery of the package, is coupled to a predetermined bonding pad 44 on the picture frame of the package as more fully described with respect to FIGS. 6 and 7. Conductors 20 and 22 couple the power bus 14 and the ground bus 16, respectively, to bonding pads or terminals 24 and 26 respectively, which in turn are coupled with I/O pins to be coupled to an off-package voltage source (not shown).

Figure 3:
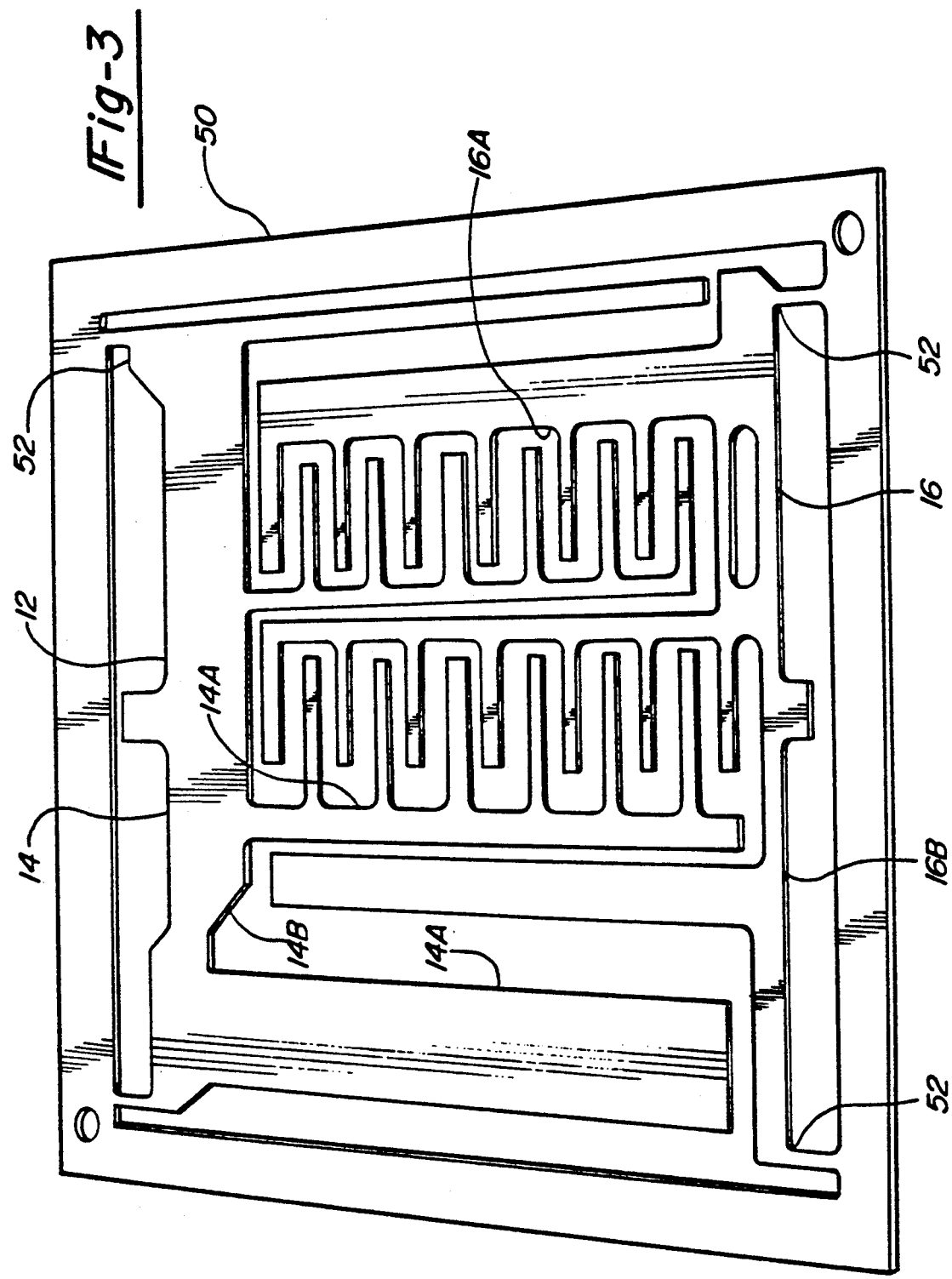
FIG. 3 is a perspective top view of one embodiment of a grid of the power distribution system of the present invention.

FIG. 3 depicts another embodiment of a grid 12 in its manufacture frame 50. The shape and width of fingers 14A and 16A and header bars 14B and 16B can be varied to meet the design parameters and power requirements of the IC (not shown) and the mechanical requirements of the package. The grid is separated from frame 50 by cutting the grid from the frame at cut points 52.

Figure 4:
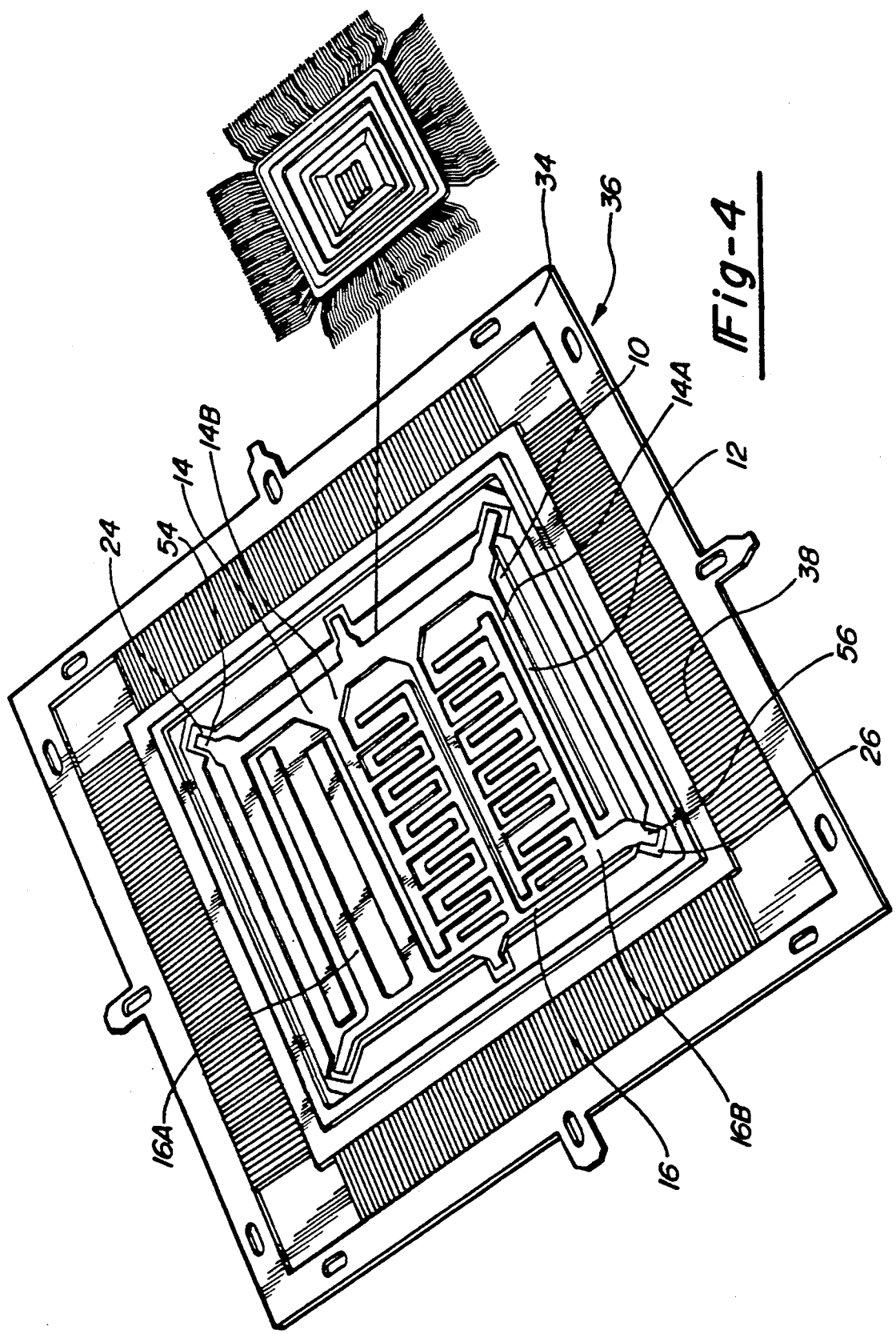
FIG. 4 is a perspective view of an IC package with an IC fitted with another embodiment of the grid of the present invention.

FIG. 4 illustrates a grid 12 attached to an IC and mounted in a package 36. In this application, the grid includes power conductor tabs 54 and ground conductor tabs 56 to couple the grid to package power and ground pads 24 and 26 respectively. The conductors 28 and 39 have been omitted for clarity. In this embodiment the busses 14 and 16 are directly connected to the power and ground pads 24 and 26 of the picture frame 60 directly without the need of ribbon conductors 20 and 22.

It is contemplated that the grid will be made of a highly conductive material and to be sufficiently thick to minimize voltage drop as current flows through it. For example, the grid can be made of gold plated oxygen free copper 20 mils. thick. The gold plate is preferably not less than 0.1 mil. thick. The insulative layer (not shown) between the grid and chip is preferably about 20 mil.

Figure 5:
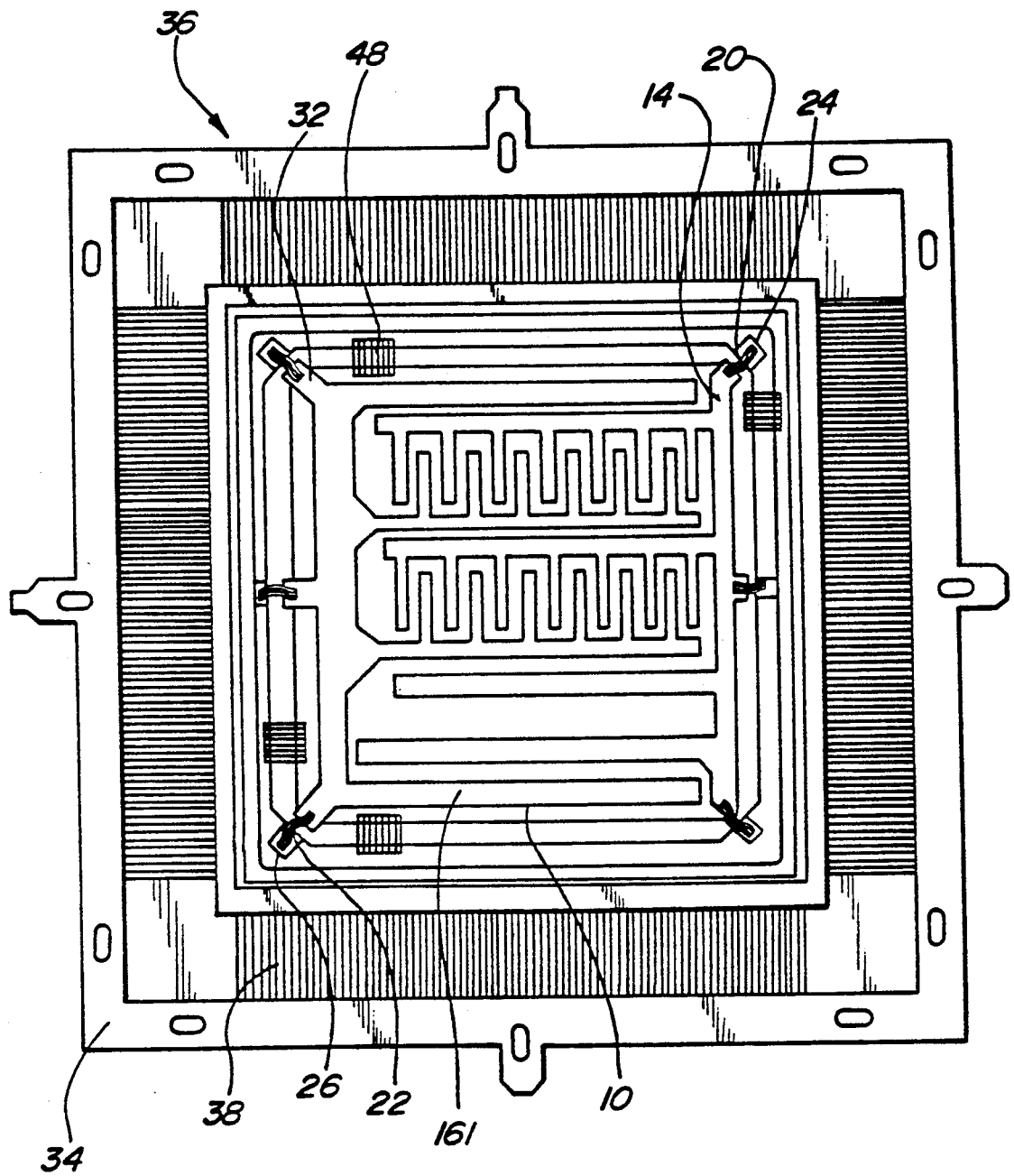
FIG. 5 is a top view of the IC package depicted in FIG. 2.

The embodiment of FIG. 3 is depicted in top view in FIG. 5. In this embodiment, conductors 20 and 22 are conductive strips or ribbons soldered to the grid's tabs 32 and to large bonding pads 24 and 26 respectively on the package 36. Conductors or wire bonds 28 and 30 (not shown) couple the IC 10 to the grid. Wire bonds 48 (only a few are shown for illustration) couple the IC to the package's I/O pins via the bonding pads 44 (See FIG. 6).

The preferred embodiment is contemplated for use with a large "superchip" containing several macrocells. Each macrocell requires power and ground. In prior art systems, large metallized areas on the superchip would be required to provide the required power, using up area that could be used for interconnects between macrocells and causing the mean distance between macrocells to increase. This is undesirable because it increases interconnect complexity and increases mean propagation delay in signals between macrocells.

It is contemplated that the preferred embodiment of the present invention will use a thick (relative to conventional thin film metallization used in the IC) and highly conductive grid 12 attached to the top surface of the superchip 10. The grid is attached to the superchip using a non-conductive glue, such as a silicone based RTV for example, to form an insulative layer between the grid and the superchip. The grid's fingers 14A and 16A are shaped and interleaved so that only short wire bonds 28 and 30 are needed to down bond from the grid to each macrocell. The relatively large dimensions of the grid and the short length of the wire bonds provide a low resistance path to the macrocells, thereby providing power to the macrocells with very little voltage drop.

Figure 6:
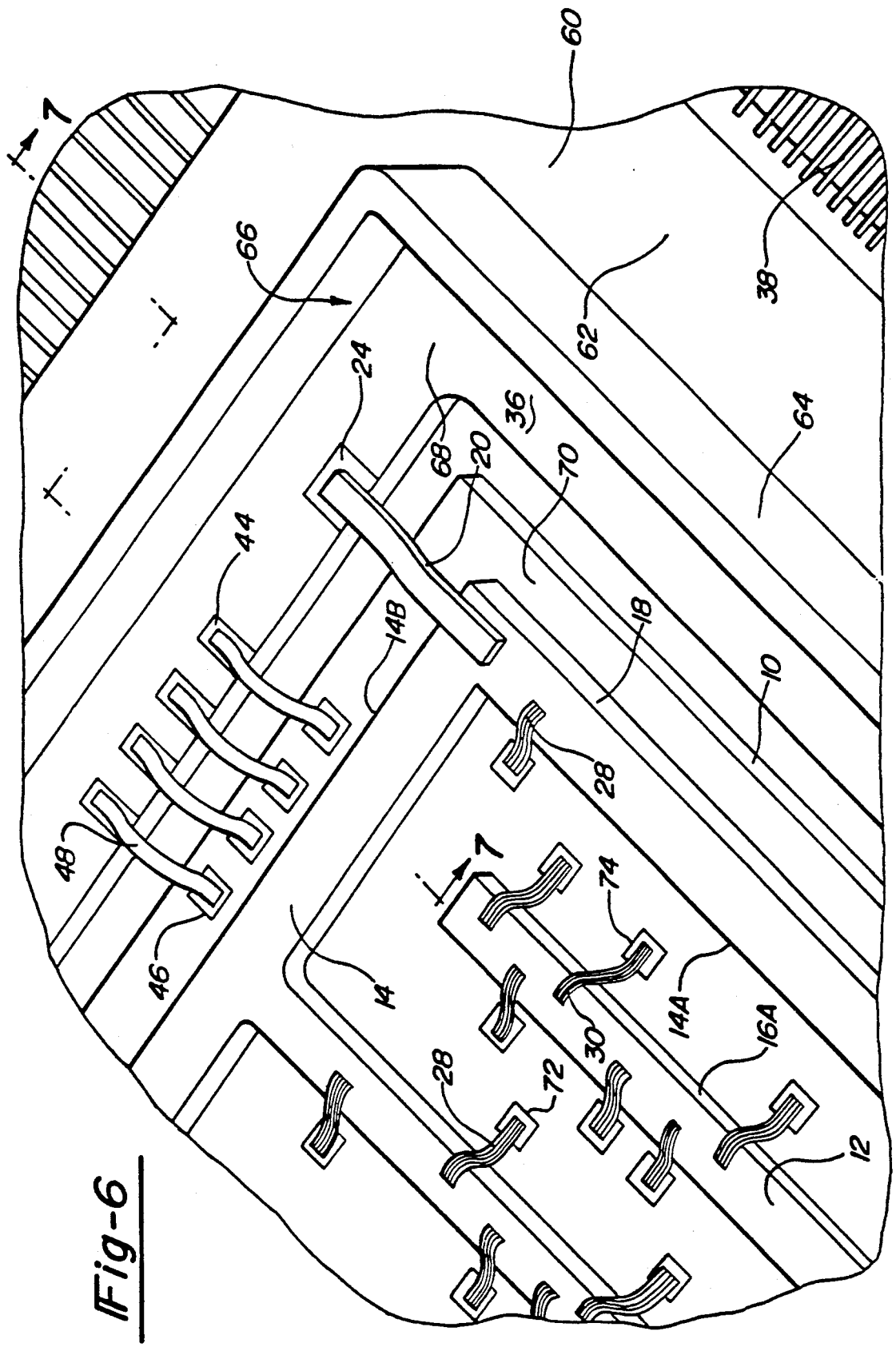
FIG. 6 is an enlarged sectional perspective view of the IC package of FIG. 2.

Referring to FIG. 6, the IC package 36 comprises the picture frame 60, the IC 10 and the grid 12. The picture frame 60 has an outer shelf 62 from which extend the I/O pins 38 of the package, a seal wall 64 which encloses a lid seal area 66 on four sides and an inner shelf 68. The lid, not shown, fits within and/or on top of wall 64 to seal area 66. Along the periphery of inner shelf 68 are package I/O pads 44. Conductors 48, wire bonds or ribbons, electrically connect pads 44 with the IC I/O pads 46. A ground bus 14 is connected to the power I/O pins of the package by ribbon conduit 20 which is soldered to the package power pad 24. Similarly, the ground bus 16 is connected to the package's ground I/Os by a ribbon conduit 22 (not shown) to the package ground pad 26 (not shown). The grid 12 is attached to the top 70 of the IC 10 with a electrically insulated adhesive 18 which has been described above. The power bus is connected to predetermined points on the IC by wire bonds or ribbon bonds 28. In a similar fashion, the ground bus 16 is electrically connected to the IC by wire bonds or conductive ribbons 30 to IC pads 74. After the package is assembled, the wire bonds, ribbon conductors or conductors are secured between the package, the grid and the IC, the package can be sealed by inserting a lid onto the sealing wall 64 to protect the IC/grid/package conductive assembly.

Figure 7:
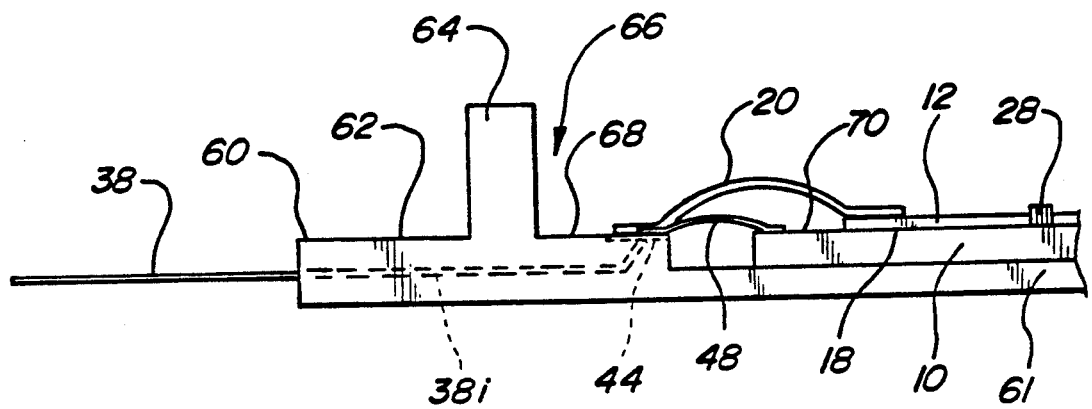
FIG. 7 is a partial cross-sectional view of the IC package of FIG. 6 taken a lines 7—7.

FIG. 7 is a partial cross section of the IC package. The picture frame 60 has an outer shelf 62, a sealing wall 64, an inner shelf 68 and I/O pins 38 extending from the edge of the outer shelf 62. In the cross section shown, the I/O pin 38 is connected to the package pad 44 by a conductor 38i within the picture frame. The IC is attached to the bottom plate 61 of the picture frame by conventional means. The grid 12 is secured to the top 70 of the IC with a non-conductive adhesive 18. The power bus 14 of the grid is attached to the package power pad 24 (not shown) by ribbon conduit 20. The IC's I/Os are connected electrically to the package I/Os by conduit 48 which is soldered to pad 44 which is connected directly to I/O pins 38.

Figure 8:
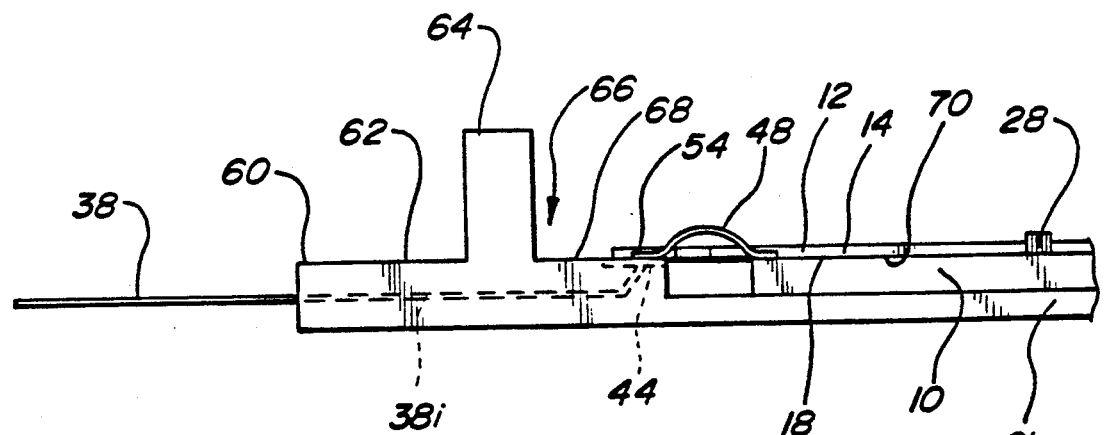
FIG. 8 is a partial cross-sectional view, similar to the view of FIG. 7, of an IC package similar to the IC package of FIG. 4.

FIG. 8 is a cross section of an IC package similar to that of FIG. 7 except the embodiment of the package is that shown in FIG. 4. The picture frame has an outer shelf 62, a sealing wall 64, inner shelf 68 and I/O pins 38. The I/O pins are electrically connected to the package I/O pads 44 by conductor 38i within the picture frame. The IC is secured to the bottom plate 61 of the picture frame by conventional means. The grid 12 is connected to the package power and ground pads by extensions of the power bus 14 and the ground bus (not shown). The ground bus 14 has tabs 54 which extend out beyond the periphery of the IC to make contact with the power pads 24 (not shown) of the package. The I/O pads (not shown) of the IC are attached to the I/O pads 44 of the package with ribbon conduits 48.

Although the preferred embodiment has been described in an application with only one IC, the invention is not limited to application of one IC. This description was provided as an illustration of one manner in which to practice the invention. Other embodiments can be practiced. For example, large grids may be designed to bring power to several ICs. In this example, the large grid may be used to bring power to several ICs encapsulated in a multichip module. In another embodiment, the grid may contain several power busses so that different voltages can be provided to the IC(s) to fit the needs of the application. Other design specific modifications, such as the material or shape of the grid, or the adhesive used to attach the grid to the IC, could be performed using ordinary skill in the art without departing from the spirit and scope of the invention.

What is claimed is:

1. A power distribution system for distributing power to an integrated circuit (IC) die where the IC die is incorporated in a package, the power distribution system comprising:
   an IC die;
   a package picture frame for mounting the IC die and for electrically coupling the IC die to the package picture frame I/O pins to provide the IC die access to signal lines, power and ground;
   a grid attached to the top surface of the IC die for providing power and ground to the IC die, the grid having separate power and ground busses in the same plane;
   an insulated layer adapted to be positioned between the bottom surface of the grid and the top surface of the IC dies for electrically insulating the grid from the IC die;
   first conductors for electrically coupling the top surface of the grid to the power and ground pads of the package; and second conductors for electrically coupling the top surface of the grid to the power and ground terminals of the IC die;
   power and ground busses independently and electrically coupled to preselected input/output (I/O) pins on the package, the preselected I/O pins being electrically connected to off-package voltage sources; and
   the power and ground busses adapted for being independently electrically coupled from their top surface directly to preselected pads on the IC die's top surface, the geometry of the power and ground busses adapted to skirt the preselected pads.

2. The system of claim 1 wherein the insulative layer includes a compliant non-conductive adhesive for attaching the bottom surface of the grid to the top surface of the IC die.

3. The system of claim 1 wherein the power and ground busses lie in a single plane on the top surface of IC die.

4. The system of claim 3 wherein each of the power and ground busses have a plurality of fingers, the fingers of the busses being interleaved in a spaced apart relationship.

5. The system of claim 1 wherein the power bus is electrically coupled to the IC die by at least one conductor and the ground bus is electrically coupled to the IC die by at least one conductor.

6. The system of claim 1 wherein the power and ground busses are made of gold plated oxygen-free copper.

7. The system of claim 1 wherein the grid is attached to a plurality of IC dies.

8. A power distribution system for distributing power to an integrated circuit (IC) die, the power distribution system comprising:
   an IC die;
   a package picture frame for mounting the IC die and for electrically coupling the IC die to the package I/O pins to provide the IC electrical access to off-package signal lines, power and ground;
   a grid, attached to the top surface of the IC die, for providing power and ground to the IC die;
   the grid having separated power and ground busses on the same plane on the top surface of the IC die, the power and ground busses being interleaved in a non-touching relationship and extending in a spaced apart side-by-side relationship across the IC die;
   the bottom surface of the grid separated from the top surface of the IC by an insulative layer;
   first conductors, connected between the grid's top surface and I/O pads on the package electrically connected to the package I/O pins that are adapted to be electrically coupled to off-package voltage sources; and
   second conductors, connected between the grid's top surface and power and ground pads on the IC die's top surface for electrically coupling the IC die to power and ground.

9. The system of claim 7 wherein the grid is attached to the tops of a plurality of IC dies.

10. The system of claim 7 wherein the insulative layer includes a compliant non-conductive adhesive for attaching the bottom surface of the grid to the top surface of the IC die.

11. The system of claim 7 wherein the power and ground busses lie in a single plane and are interleaved in a non-touching relationship.

12. The system of claim 7 wherein the grid is electrically coupled to the IC die power and ground pads by wire bonds.

13. The system of claim 7 wherein the power and ground busses are made of gold plated oxygen-free copper.

* * * * *